United States Patent
Ahn

(10) Patent No.: US 7,655,521 B2
(45) Date of Patent: Feb. 2, 2010

(54) METHOD OF FABRICATING SEMICONDUCTOR MEMORY DEVICE

(75) Inventor: Jung Ryul Ahn, Namyangju-si (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 0 days.

(21) Appl. No.: 12/124,024

(22) Filed: May 20, 2008

(65) Prior Publication Data

US 2009/0053871 A1 Feb. 26, 2009

(30) Foreign Application Priority Data

Aug. 20, 2007 (KR) .................. 10-2007-0083348

(51) Int. Cl.
 *H01L 21/336* (2006.01)
(52) U.S. Cl. ............ 438/257; 438/264; 257/E21.679
(58) Field of Classification Search ........... 257/E21.18, 257/E21.679, E21.678, 314, 315, 316, 321, 257/324, E29.209, E21.21, E21.423; 438/257, 438/261, 264, 424
See application file for complete search history.

(56) References Cited

U.S. PATENT DOCUMENTS

| | | | |
|---|---|---|---|
| 6,642,105 B2 * | 11/2003 | Kim et al. | 438/257 |
| 7,038,291 B2 * | 5/2006 | Goda et al. | 257/510 |
| 2007/0210368 A1 * | 9/2007 | Cho et al. | 257/314 |
| 2007/0284651 A1 * | 12/2007 | Sim et al. | 257/324 |

FOREIGN PATENT DOCUMENTS

| KR | 100195243 | 2/1999 |
|---|---|---|
| KR | 1020030008990 | 1/2003 |
| KR | 1020050039627 | 4/2005 |
| KR | 100660551 | 12/2006 |

OTHER PUBLICATIONS

Notice of Allowance dated Feb. 20, 2009, for Korean application No. 10-2007-0083348.

* cited by examiner

*Primary Examiner*—Hsien-ming Lee
*Assistant Examiner*—Shaka Scarlett
(74) *Attorney, Agent, or Firm*—Lowe Hauptman Ham & Berner, LLP

(57) ABSTRACT

A semiconductor memory device and method of fabricating a semiconductor memory device, wherein a tunnel insulating layer, a first charge trap layer and an isolation mask layer are sequentially stacked over a semiconductor substrate in which a cell region and a peri region are defined. The isolation mask layer, the first charge trap layer, the tunnel insulating layer and the semiconductor substrate are etched to thereby form trenches. An isolation layer is formed within each trench. The first charge trap layer is exposed by removing the isolation mask layer formed in the cell region. A second charge trap layer is formed on the exposed first charge trap layer and the isolation layer. A blocking layer and a control gate are formed over the semiconductor substrate in which the second charge trap layer is formed.

15 Claims, 3 Drawing Sheets

METHOD OF FABRICATING SEMICONDUCTOR MEMORY DEVICE

CROSS-REFERENCES TO RELATED APPLICATIONS

The present application claims priority to Korean patent application number 10-2007-0083348, filed on Aug. 20, 2007, which is incorporated by reference in its entirety.

BACKGROUND OF THE INVENTION

The present invention relates to a method of fabricating a semiconductor memory device and, more particularly, to a method of fabricating a semiconductor memory device, which can prevent electron migration within a charge trap layer.

A semiconductor memory device can be largely classified into a volatile memory device, which retains its data only when voltage is applied thereto, but loses its data when the application of voltage thereto is stopped, and a non-volatile memory device that retains its data even when the application of voltage is stopped. Of them, a non-volatile memory device has been in the spotlight because it retains its data even after the application of power is stopped. Active research has now been made on the non-volatile memory device.

A flash memory device is a representative one of the non-volatile memory devices. Recently, the size of the flash memory device becomes very small and the capacity thereof has greatly increased.

The flash memory device is described below in more detail.

A general flash memory device has a structure in which a tunnel insulating layer along which electrons are moved, a floating gate for storing data therein, a dielectric layer for preventing the leakage of charges, and a control gate for transferring voltage are sequentially stacked over a semiconductor substrate.

Meanwhile, a flash memory device that has recently been developed has a structure in which a tunnel insulating layer along which electrons are moved, a charge trap layer which traps charges and is formed from insulating material, a blocking layer for preventing trapped charges from leaking to a control gate, and the control gate for transferring voltage are sequentially stacked.

A conventional flash memory device, including the charge trap layer, is fabricated by first forming a low voltage NMOS transistor (LVN) and a high voltage NMOS transistor (HVN), which are used in a peri circuit, and then forming a memory cell to be used as a storage medium. However, in this memory cell formed according to the above sequence, charge trap layers used as trap layers of electrons are not isolated in the direction of a string in view of the manufacturing process. This is because electrons are trapped in the charge trap layer only when voltage is applied from the control gate and the trapped electrons are rarely moved unless external voltage is applied, in terms of the charge trap layer.

However, if a program operation is performed on a selected memory cell, electrons trapped in a memory cell adjacent to the selected memory cell can be moved through the charge trap layer due to a high program voltage.

In particular, the electron trap rate of the charge trap layer does not exceed about 70% when compared with the floating gate. Accordingly, the threshold voltage may be changed due to a trap characteristic that is short of about 30%.

Due to this trap characteristic of the charge trap layer, at the time of a program operation, electrons of an unselected memory cell move to a neighboring isolation layer or in the direction of a selected memory cell, which may change the threshold voltage. It may degrade a retention characteristic, that is, a charge retention capability. Consequently, the threshold voltage of a programmed memory cell is lowered as much as the amount of electrons that have exited, so that program efficiency can be lowered.

BRIEF SUMMARY OF THE INVENTION

The present invention is directed to prevent electrons, trapped in a multi-layered first charge trap layer, from moving at the time of a program operation, by first forming the multi-layered first charge trap layer and then forming an isolation layer of a shallow trench isolation (STI) structure in order to separate the multi-layered first charge trap layer.

Furthermore, the present invention is directed to compensate for the trap characteristic of the multi-layered first charge trap layer, which may be damaged at the time of the isolation layer process, and prevent a change of the threshold voltage at the time of a program operation, by forming the multi-layered first charge trap layer and the isolation layer and then further forming a second charge trap layer.

Furthermore, the present invention is directed to easily form a transistor in a peri region by first forming a charge trap layer of a cell region and then forming the peri region.

According to a method of fabricating a semiconductor memory device in accordance with an aspect of the present invention, a tunnel insulating layer, a first charge trap layer and an isolation mask layer are sequentially stacked over a semiconductor substrate in which a cell region and a peri region are defined. The isolation mask layer, the first charge trap layer, the tunnel insulating layer and the semiconductor substrate are etched to thereby form trenches. An isolation layer is formed within the trench. The first charge trap layer is exposed by removing the isolation mask layer formed in the cell region. A second charge trap layer is formed on the exposed first charge trap layer and the isolation layer. A blocking layer and a control gate are formed over the semiconductor substrate in which the second charge trap layer is formed.

The peri region includes a low voltage NMOS transistor (LVN) region and a high voltage NMOS transistor (HVN) region.

Before the tunnel insulating layer, the first charge trap layer and the isolation mask layer are sequentially stacked over the semiconductor substrate in which the cell region and the peri region are defined, a first insulating layer and a pad layer are formed over the semiconductor substrate, the pad layer and the first insulating layer formed in the HVN region are removed, a second insulating layer is formed on the HVN region, and the pad layer and the first insulating layer formed in the cell region are then removed.

The pad layer is formed from a nitride layer. Before the blocking layer and the control gate are formed after the second charge trap layer is formed, the isolation mask layer, the first charge trap layer, a pad layer and a first insulating layer of the peri region are removed.

The first charge trap layer is formed from a plurality of charge trap layers with different trap characteristics of electrons. A charge trap layer located at the lowest place, of the plurality of charge trap layers, has a trap characteristic higher than that of a charge trap layer located on an upper side.

The second charge trap layer has a trap characteristic higher than that of the first charge trap layer. Each of the plurality of charge trap layers is formed to a thickness of 5 to 100 angstrom. Each of the plurality of charge trap layers is formed from material including Si and N. A trap characteristic of the first charge trap layer is controlled according to a composition ratio of the Si and N. The Si and N have a composition ratio of 1:1 to 1:3, or 1:1 to 3:1.

The second charge trap layer is formed to a thickness of 5 to 100 angstrom. The second charge trap layer is formed from material including Si and N. A trap characteristic of the second charge trap layer is controlled according to a composition ratio of the Si and N. The Si and N have a composition ratio of 1:1 to 1:3, or 1:1 to 3:1.

The isolation mask layer is formed from an oxide layer. The blocking layer is formed from an oxide layer or a nitride layer, or has a dual structure of an oxide layer and a nitride layer. The oxide layer is formed from any one of a silicon oxide layer, a hafnium oxide layer and a tantalum oxide layer. The blocking layer is formed to a thickness of 10 to 500 angstrom.

DESCRIPTION OF SPECIFIC EMBODIMENTS

Now, a specific embodiment according to the present invention will be described with reference to the accompanying drawings. However, the present invention is not limited to the disclosed embodiment, but may be implemented in various manners. The embodiment is provided to complete the disclosure of the present invention and to allow those having ordinary skill in the art to understand the scope of the present invention. The present invention is defined by the category of the claims.

FIGS. 1A to 1J are sectional view illustrating a method of fabricating a semiconductor memory device in accordance with the present invention.

Figure 1A:
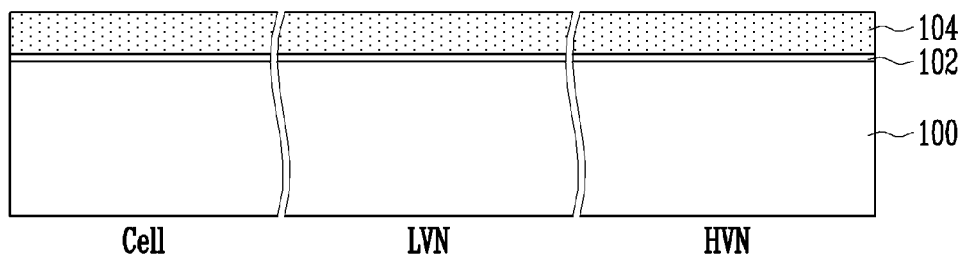
FIGS. 1A to 1J are sectional view illustrating a method of fabricating a semiconductor memory device in accordance with the present invention.

Referring to FIG. 1A, a first insulating layer 102 for forming unit elements and a pad layer 104 for forming a LVN are sequentially formed over a semiconductor substrate 100. The first insulating layer 102 can be formed from an oxide layer and the pad layer 104 can be formed from a nitride layer.

Figure 1B:
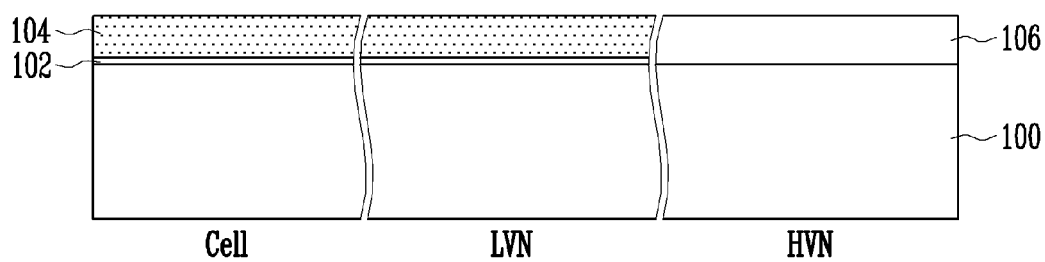

Referring to FIG. 1B, a hard mask pattern (not shown) in which a HVN region is opened is formed on the pad layer 104. An etch process is performed along the hard mask pattern (not shown), thus removing the pad layer 104 and the first insulating layer 102 formed in the HVN region. Next, an oxidization process is performed in order to form a second insulating layer 106, that is, an insulating layer for a HVN. The hard mask pattern (not shown) is then removed. Here, the LVN region and the HVN region can be called a peri region (LVN and HVN).

Figure 1C:
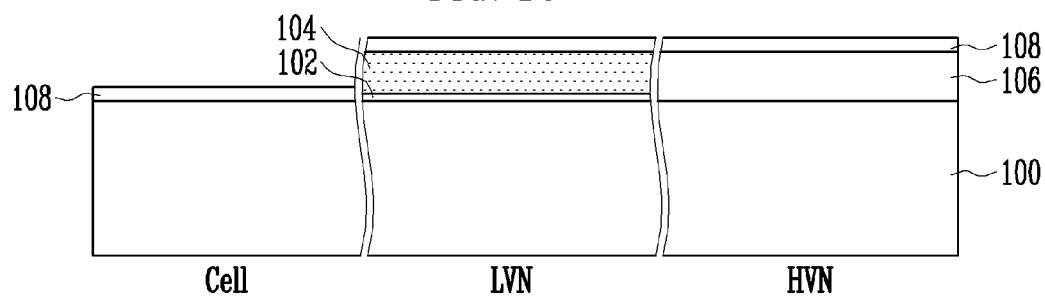

Referring to FIG. 1C, a hard mask pattern (not shown) in which a cell region Cell is opened is formed over the semiconductor substrate 100. The pad layer 104 and the first insulating layer 102 formed in the cell region are removed by performing an etch process along the hard mask pattern (not shown). The hard mask pattern (not shown) is then removed. A third insulating layer 108 for a tunnel insulating layer is formed over the exposed semiconductor substrate 100, the pad layer 104 and the second insulating layer 106. The third insulating layer 108 can be formed from an oxide layer. The third insulating layer 108 can be formed to a thickness of 10 to 100 angstrom.

Figure 1D:
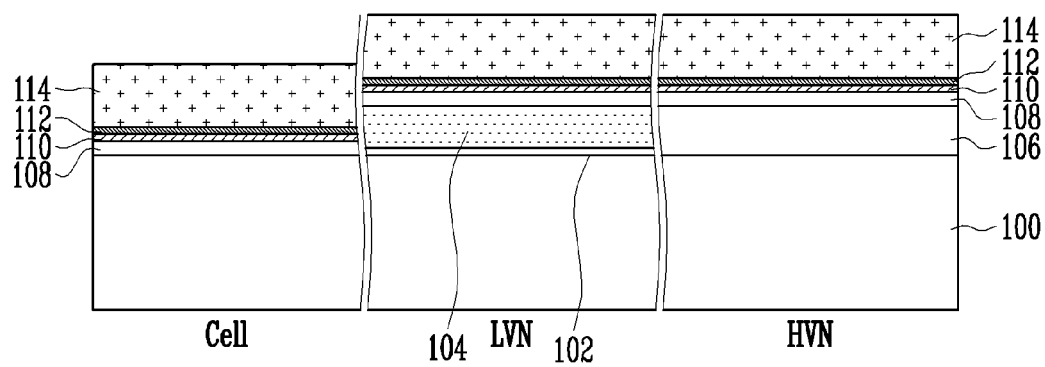

Referring to FIG. 1D, a first charge trap layer 110 and a second charge trap layer 112 are sequentially formed over the third insulating layer 108. The first charge trap layer 110 can be formed to a thickness of 5 to 100 angstrom. The second charge trap layer 112 can be formed to a thickness of 5 to 100 angstrom.

The first charge trap layer 110 and the second charge trap layer 112 can be formed from a nitride layer, including Si and N. In particular, the trap characteristics of the first charge trap layer 110 and the second charge trap layer 112 can be controlled depending on the composition ratio of Si and N.

For example, the composition ratio of Si and N, included in the first charge trap layer 110 or the second charge trap layer 112, can be controlled to have a ratio of 1:1 to 1:3 or 3:1 to 1:1. Here, in order for the trap characteristic of the first charge trap layer 110 to be better than that of the second charge trap layer 112 (deep trap level), the composition ratio of Si and N can be controlled such that electrons trapped in the first charge trap layer 110 do not move.

For example, the contents of N included in the first charge trap layer 110 can be controlled to be greater than that of Si included in the first charge trap layer 110. Here, the composition ratio of N and Si can be controlled so that the contents of N included in the first charge trap layer 110 is greater than that of N included in the second charge trap layer 112.

In one embodiment, only the second charge trap layer 112 can be formed without forming the first charge trap layer 110. However, if the charge trap layer has a plurality of layers (for example, two layers) as described above, a boundary face is formed between the first charge trap layer 110 and the second charge trap layer 112, so the trap characteristic of electrons can be further improved.

Next, an isolation mask layer 114 is formed on the second charge trap layer 112. The isolation mask layer 114 can be formed from an oxide layer by performing an oxidization process.

Figure 1E:
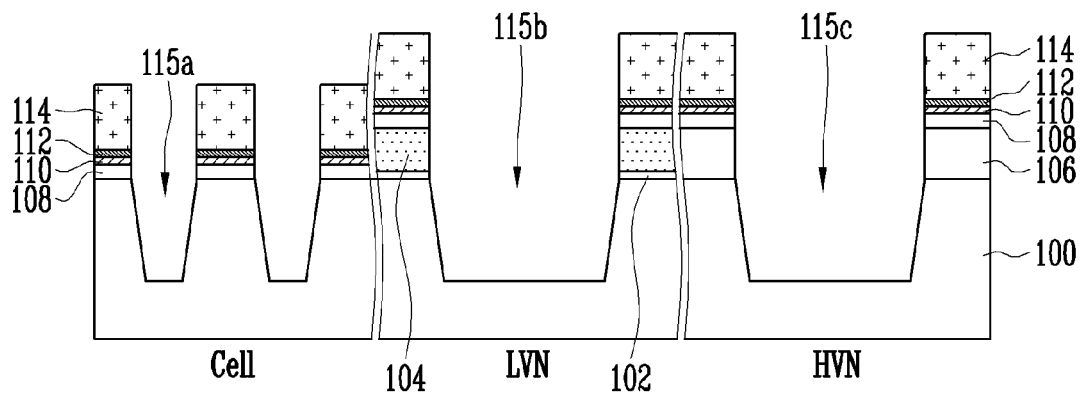

Referring to FIG. 1E, a hard mask pattern (not shown) in which an isolation region is opened in order to isolate elements is formed on the isolation mask layer 114. An etch process is performed along the hard mask pattern (not shown).

In the cell region, according to the etch process, the isolation mask layer 114, the second charge trap layer 112, the first charge trap layer 110 and the third insulating layer 108 are patterned, and a part of the exposed semiconductor substrate 100 is removed, thus forming trenches 115a.

In the LVN region, according to the etch process, the isolation mask layer 114, the second charge trap layer 112, the first charge trap layer 110, the third insulating layer 108, the pad layer 104 and the first insulating layer 102 are patterned, and a part of the exposed semiconductor substrate 100 is removed, thus forming a trench 115b.

In the HVN region, the isolation mask layer 114, the second charge trap layer 112, the first charge trap layer 110 and the second insulating layer 106 are patterned, and a part of the exposed semiconductor substrate 100 is removed, thus forming a trench 115c.

As the trenches 115a, 115b and 115c are formed, the first and second charge trap layers 110 and 112 in which electrons are stored are separated from each other. Thus, electrons trapped in the first and second charge trap layers 110 and 112 can be prevented from moving to a neighboring memory cell region. Since the movement of trapped electrons is prevented, the retention characteristic of a memory cell can be improved.

Meanwhile, at the time of the etch process for forming the trenches 115a, 115b and 115c, the first charge trap layer 110 and the second charge trap layer 112 may be damaged by the etch process. If the charge trap layers 110 and 112 are damaged, the trap characteristic of electrons can be degraded. This can be compensated for by further forming a third charge trap layer after a subsequent isolation layer is formed. This is described later on with reference to FIG. 1H. The hard mask pattern (not shown) is then removed.

Figure 1F:
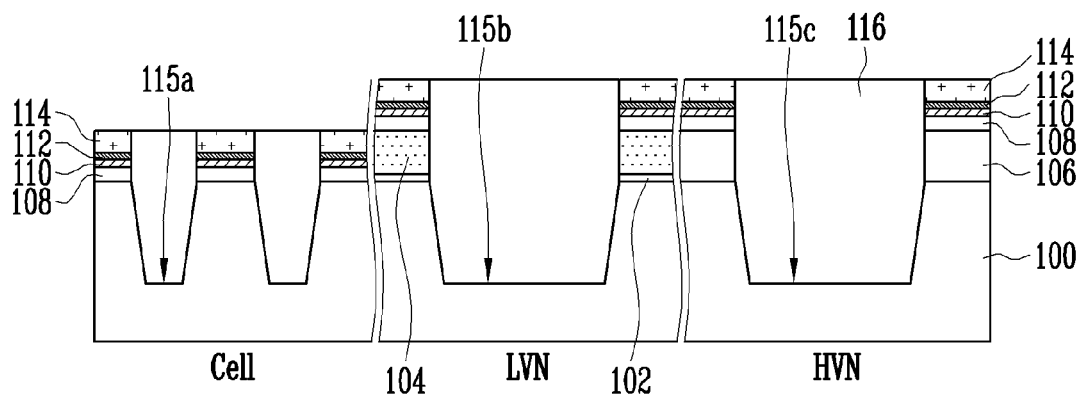

Referring to FIG. 1F, an insulating layer is formed in order to gap-fill the trenches 115a, 115b and 115c. The insulating layer is polished in such a way as to expose the isolation mask layer 114, thus forming an isolation layer 116. The polishing process can be performed using a chemical mechanical polishing (CMP) process. By performing the polishing process, a step between the cell region and the peri circuit region (LVN and HVN) can be reduced. The insulating layer used as the isolation layer 116 can be formed from an oxide layer.

Figure 1G:
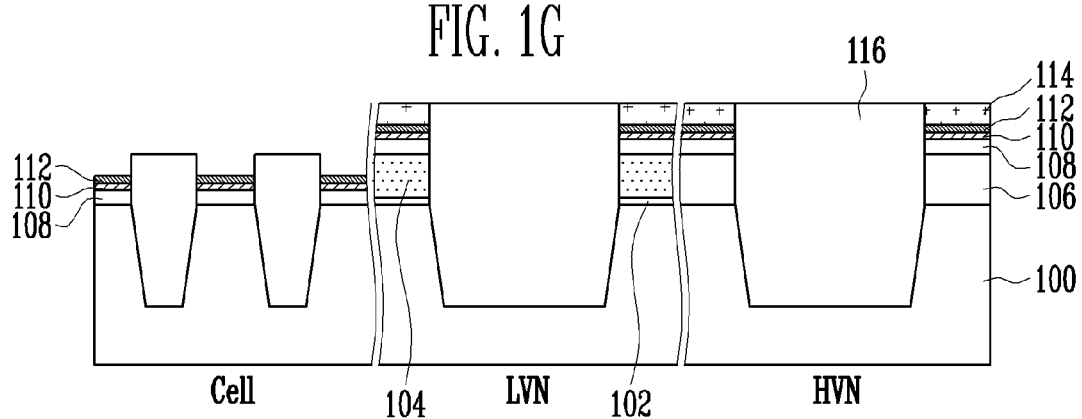

Referring to FIG. 1G, a hard mask pattern (not shown) in which the cell region is opened is formed over the semiconductor substrate 100 in which the isolation layer 116 is formed. The isolation mask layer 114 of the cell region is removed by performing an etch process along the hard mask pattern (not shown). When the second charge trap layer 112 is exposed, the isolation layer 116 of the cell region remains in a protruding shape. The hard mask pattern (not shown) is then removed.

Figure 1H:
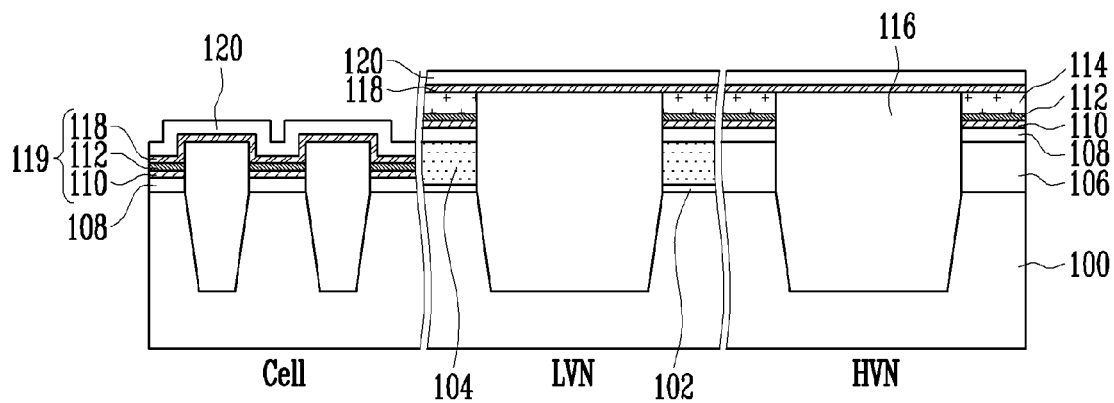

Referring to FIG. 1H, a third charge trap layer 118 is formed on the surfaces of the cell region and the peri region (LVN and HVN). The third charge trap layer 118 is formed to compensate for the trap characteristics of the first and second charge trap layers 110 and 112, which has been degraded in the process of forming the isolation layer 116. In particular, the third charge trap layer 118 is formed on the second charge trap layer 112 and the isolation layer 116 in the cell region and is therefore shared by neighboring cells. To this end, the third charge trap layer 118 can be formed from a layer having an excellent trap characteristic in order to prevent electrons, which are trapped at the time of a program operation, from moving to a neighboring isolation layer 116 or in a cell direction. A method of forming the third charge trap layer 118 is described below.

The third charge trap layer 118 can be formed to a thickness of 5 to 100 angstrom. The third charge trap layer 118 can be formed from a nitride layer, including Si and N. Here, the trap characteristic of the third charge trap layer 118 can be varied depending on the composition ratio of Si and N. For example, Si and N included in the third charge trap layer 118 can have a composition ratio of 1:1 to 1:3 or 3:1 to 1:1. As the contents of N increases, the trap characteristic is improved. The trap characteristic of the third charge trap layer 118 can be controlled to be identical to or higher than that of the second charge trap layer 112 by controlling the composition ratio.

The first and third charge trap layers 110 and 118 function to prohibit electrons, trapped in the second charge trap layer 112 by a program operation, from moving, so that a change of the program threshold voltage can be prevented. The first to third charge trap layers 110, 112 and 118 constitute a charge trap layer 119.

A blocking layer 120 for insulating the charge trap layer 119 and a control gate is formed on the charge trap layer 119. The blocking layer 120 can be formed from an oxide layer or a nitride layer, or can have a dual structure of an oxide layer and a nitride layer. Here, the oxide layer can be formed using one of a silicon oxide layer, a hafnium oxide layer and a tantalum oxide layer. The blocking layer 120 can be formed to a thickness of 10 to 500 angstrom.

Figure 1I:
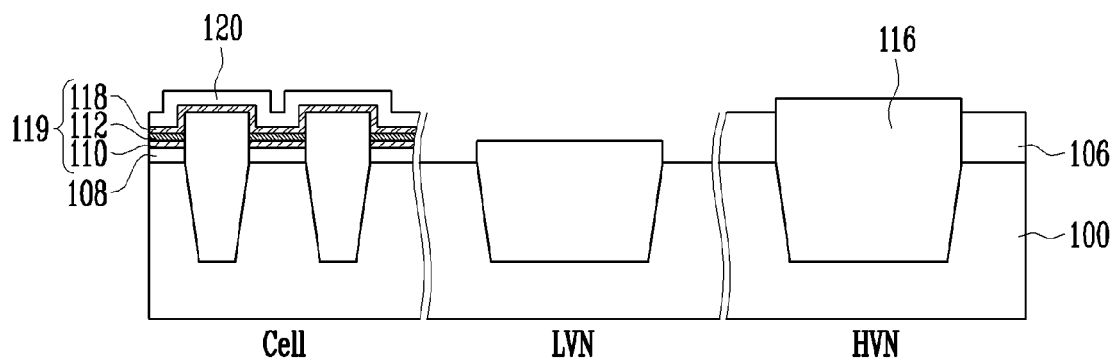

Referring to FIG. 1I, a hard mask pattern (not shown) in which the peri region (LVN and HVN) is opened is formed on the entire structure including the blocking layer 120. An etch process is performed along the hard mask pattern (not shown). The blocking layer 120, the third charge trap layer 118, the isolation mask layer 114, the second charge trap layer 112, the first charge trap layer 110, the third insulating layer 108, the pad layer 104 and the first insulating layer 102 of the peri region (LVN and HVN) are removed by performing an etch process.

Here, a part of an exposed top surface of the isolation layer 116 in the peri region (LVN and HVN) is also removed, so that the height of the isolation layer 116 is lowered. Furthermore, a part of a top surface of the second insulating layer 106 of the HVN region is removed, so that the height of the second insulating layer 106 is lowered. Accordingly, in the LVN region, the isolation layer 116 and the semiconductor substrate 100 are exposed and, in the HVN region, the isolation layer 116 and the second insulating layer 106 are exposed.

Figure 1J:
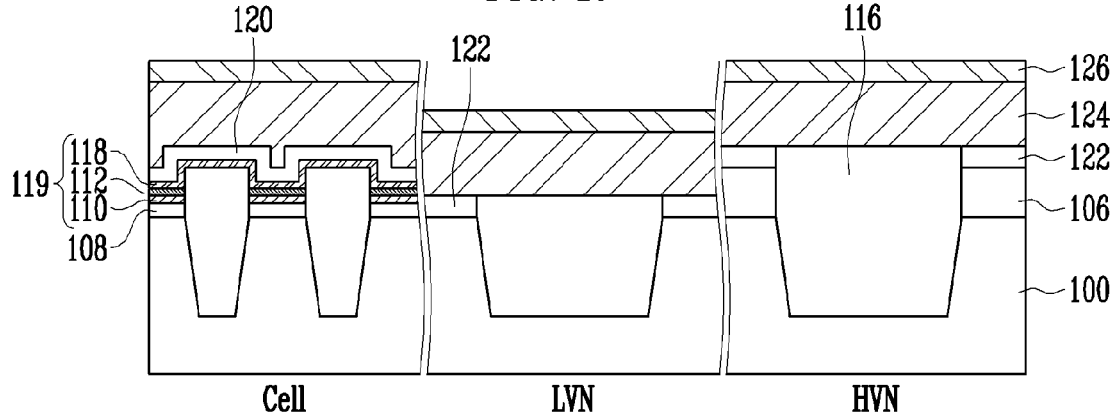

Referring to FIG. 1J, an oxidization process is performed in order to form a fourth insulating layer 122 for a gate dielectric layer on the peri region (LVN and HVN). The hard mask pattern (not shown), described with reference to FIG. 1I, is then removed.

As described above, after the charge trap layer 119 of the cell region is formed, the fourth insulating layer 122 for the gate dielectric layer is formed in the peri region (LVN and HVN). Therefore, the thickness of the gate dielectric layer can be controlled easily. Accordingly, a transistor can be formed in the peri region (LVN and HVN) conveniently.

A control gate 124 and a hard mask pattern 126 for a gate pattern are formed on the cell region and the peri region (LVN and HVN). The control gate 124 can be formed from a polysilicon layer or have a stacked structure of a polysilicon layer and a metal layer. Although not shown in the drawing, patterned gate lines (or word lines) are formed by performing an etch process along the hard mask pattern 126.

As described above, according to the present invention, after the multi-layered first charge trap layer is formed, the isolation layer is formed. Accordingly, electrons trapped in the multi-layered first charge trap layer can be prevented from moving at the time of a program operation and, therefore, a retention characteristic can be improved.

Furthermore, after forming the multi-layered first charge trap layer and the isolation layer, the second charge trap layer is further formed. Accordingly, the trap characteristic of the multi-layered first charge trap layer, which may be damaged at the time of the isolation layer process, can be compensated for and a change of the threshold voltage at the time of a program operation can be prevented.

Furthermore, after the charge trap layer of the cell region is first formed and the peri region is then formed, a transistor can be formed in the peri region easily.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A method of fabricating a semiconductor memory device, the method comprising:
  providing a semiconductor substrate having a cell region and a peripheral region, wherein the peripheral region includes a low voltage NMOS transistor (LVN) region and a high voltage NMOS transistor (HVN) region;
  forming a first insulating layer and a pad layer over the semiconductor substrate;
  removing the pad layer and the first insulating layer formed in the HVN region;
  forming a second insulating layer on the HVN region;

removing the pad layer and the first insulating layer formed in the cell region;

forming a tunnel insulating layer, a first charge trap layer, and an isolation mask layer over the semiconductor substrate of the cell region and the peripheral region;

etching portions of the isolation mask layer, the first charge trap layer, the tunnel insulating layer, the pad layer, the second insulating layer and the semiconductor substrate to form trenches;

forming an isolation layer to fill the trenches;

exposing the first charge trap layer by removing the isolation mask layer formed in the cell region;

forming a second charge trap layer on the exposed first charge trap layer and the isolation layer; and forming a blocking layer and a control gate over the semiconductor substrate in which the second charge trap layer is formed.

2. The method of claim 1, wherein the pad layer is formed from a nitride layer.

3. The method of claim 1, further comprising, removing the isolation mask layer, the first charge trap layer, a pad layer, the first insulating layer and the tunnel insulating layer of the peripheral region before the blocking layer and the control gate are formed.

4. The method of claim 1, wherein the first charge trap layer is formed from a plurality of charge trap layers having silicon (Si) and nitrogen (N), wherein each of the charge trap layers have different trap characteristics of electrons according to a composition ratio of the silicon (Si) and the nitrogen (N).

5. The method of claim 4, wherein a lowest located charge trap layer of the plurality of charge trap layers has a trap characteristic higher than that of a charge trap layer located above.

6. The method of claim 4, wherein each of the plurality of charge trap layers has a thickness of about 5 to about 100 angstrom.

7. The method of claim 4, wherein the silicon (Si) and the nitrogen (N) have a composition ratio of 1:1 to 1:3, or 1:1 to 3:1.

8. The method of claim 1, wherein the second charge trap layer is formed from materials including silicon (Si) and nitrogen (N).

9. The method of claim 8, wherein the second charge trap layer has a thickness of about 5 to about 100 angstrom.

10. The method of claim 8, wherein a trap characteristic of the second charge trap layer is controlled according to a composition ratio of the silicon (Si) and nitrogen (N).

11. The method of claim 10, wherein the silicon (Si) and nitrogen (N) have a composition ratio of 1:1 to 1:3, or 1:1 to 3:1.

12. The method of claim 1, wherein the isolation mask layer is formed from an oxide layer.

13. The method of claim 1, wherein the blocking layer is formed from an oxide layer or a nitride layer, or has a dual structure of an oxide layer and a nitride layer.

14. The method of claim 13, wherein the oxide layer is formed from any one of a silicon oxide layer, a hafnium oxide layer and a tantalum oxide layer.

15. The method of claim 1, wherein the blocking layer has a thickness of about 10 to about 500 angstrom.

* * * * *